(12) United States Patent
Huang et al.

(10) Patent No.: US 8,104,626 B2
(45) Date of Patent: Jan. 31, 2012

(54) UNIVERSAL MOUNTING BRACKET WITH SAFETY LOCK

(75) Inventors: Mushan Huang, Singapore (SG); Wenming Yang, Singapore (SG); Meng Kee Koh, Singapore (SG); Julian S. Baiza, Arlington, TX (US)

(73) Assignee: Central Industrial Supply Company, Tuscon, AZ (US)

( * ) Notice: Subject to any disclaimer, the term of this patent is extended or adjusted under 35 U.S.C. 154(b) by 797 days.

(21) Appl. No.: 12/006,584

(22) Filed: Jan. 3, 2008

(65) Prior Publication Data

US 2009/0114785 A1 May 7, 2009

Related U.S. Application Data

(63) Continuation-in-part of application No. 11/527,329, filed on Sep. 26, 2006, now Pat. No. 7,857,145.

(51) Int. Cl.
*A47F 7/00* (2006.01)

(52) U.S. Cl. .......................................................... 211/26

(58) Field of Classification Search .................. 211/187, 211/192, 86.01, 26, 153, 190, 4; 108/108, 108/106, 107; 248/200.1, 221.11, 243; 52/239; 403/321, 324, 328; 312/334.4; 70/57
See application file for complete search history.

(56) References Cited

U.S. PATENT DOCUMENTS

| | | | | |
|---|---|---|---|---|
| 471,481 A * | 3/1892 | Hart | ............................... | 211/153 |
| 1,382,505 A * | 6/1921 | Hargey | ....................... | 248/200.1 |
| 1,394,513 A * | 10/1921 | Albonesi | ........................ | 292/60 |
| 1,778,075 A * | 10/1930 | Harris | ............................. | 211/153 |
| 2,903,227 A * | 9/1959 | Key | ............................. | 248/200.1 |
| 3,221,678 A * | 12/1965 | Doherty | ..................... | 248/230.1 |
| 3,273,720 A * | 9/1966 | Seiz | ................................ | 211/192 |
| 3,337,062 A * | 8/1967 | Seiz | ................................ | 211/192 |
| 3,341,027 A * | 9/1967 | Mackin, Jr et al. | ........... | 108/188 |
| 3,362,738 A * | 1/1968 | Dygert et al. | ................. | 403/108 |
| 3,388,809 A * | 6/1968 | Irish | ............................... | 211/190 |
| 3,612,290 A * | 10/1971 | Evans | ............................ | 211/192 |
| 3,762,116 A * | 10/1973 | Anderson et al. | .............. | 52/239 |
| 3,771,466 A * | 11/1973 | Ferdinand et al. | ............ | 108/109 |
| 4,074,812 A * | 2/1978 | Skubic et al. | ................. | 211/192 |
| 4,145,849 A * | 3/1979 | Shindoll et al. | ........ | 211/119.003 |
| 4,165,854 A * | 8/1979 | Duly | ............................. | 248/408 |
| 4,188,758 A * | 2/1980 | Swann | ........................... | 52/241 |
| 4,243,342 A * | 1/1981 | Marto | ........................... | 403/324 |
| 4,257,193 A * | 3/1981 | Williams | ....................... | 49/465 |
| 4,292,902 A * | 10/1981 | Barrineau | ..................... | 108/146 |
| 4,379,430 A * | 4/1983 | Ruschitzka | .................. | 108/107 |
| 4,387,872 A * | 6/1983 | Hogue | ..................... | 248/221.11 |
| 4,516,619 A * | 5/1985 | Hasbrouck | .................... | 160/135 |

(Continued)

*Primary Examiner* — Sarah Purol
(74) *Attorney, Agent, or Firm* — Mark W Handley (57) ABSTRACT

A mounting bracket (16) has a mounting pin (24) for fitting round hole racks (18) and a mounting sleeve (26) which slidably extends over the mounting pin (24) for fitting square hole racks (12). A lock pin (28) and a lock sleeve (30) are spaced apart from the mounting pin (24) and slidably extend for fitting within holes of respective racks (18, 12) to prevent removal of the mounting pin (24) and the mounting sleeve (26) from the racks (18, 12). A safety lock (180) is located adjacent the lock pin (28) for preventing removal of the lock pin (28) from a rack mounting hole, which prevents removal of the mounting bracket (16) from the racks (12, 18). A release pin (182) extends through a rack mounting hole and the mounting bracket (16) for moving the safety lock (180) to a position located aside of the lock pin (28).

20 Claims, 6 Drawing Sheets

U.S. PATENT DOCUMENTS

| | | | |
|---|---|---|---|
| 4,519,511 A * | 5/1985 | Mendenhall | 211/187 |
| 4,602,890 A * | 7/1986 | Duda | 403/105 |
| 4,603,782 A * | 8/1986 | Fenwick | 211/153 |
| 4,635,327 A * | 1/1987 | Netznik | 24/653 |
| 4,819,817 A * | 4/1989 | Mar | 211/205 |
| 4,972,783 A * | 11/1990 | Crissman et al. | 108/107 |
| 5,095,862 A * | 3/1992 | Murphy | 123/90.61 |
| 5,148,928 A * | 9/1992 | Arnold | 211/187 |
| 5,237,791 A * | 8/1993 | Scanlan | 52/655.1 |
| 5,558,501 A * | 9/1996 | Wang et al. | 416/244 R |
| 5,571,256 A * | 11/1996 | Good et al. | 211/26 |
| 5,826,847 A * | 10/1998 | Warner et al. | 248/354.1 |
| 5,833,337 A * | 11/1998 | Kofstad | 312/334.5 |
| 5,842,586 A * | 12/1998 | Melby | 211/187 |
| 5,924,469 A * | 7/1999 | Whittemore | 160/368.1 |
| 6,155,441 A * | 12/2000 | Andersen et al. | 211/192 |
| 6,230,903 B1 * | 5/2001 | Abbott | 211/26 |
| 6,241,108 B1 * | 6/2001 | Nakatani et al. | 211/187 |
| 6,305,556 B1 * | 10/2001 | Mayer | 211/26 |
| 6,373,707 B1 * | 4/2002 | Hutchins | 361/725 |
| 6,435,354 B1 * | 8/2002 | Gray et al. | 211/26 |
| 6,442,030 B1 * | 8/2002 | Mammoser et al. | 361/727 |
| 6,443,319 B1 * | 9/2002 | Sander | 211/187 |
| 6,523,918 B1 * | 2/2003 | Baiza | 312/265.1 |
| 6,554,142 B2 * | 4/2003 | Gray | 211/26 |
| 6,578,939 B1 * | 6/2003 | Mayer | 312/334.5 |
| 6,615,992 B1 * | 9/2003 | Lauchner et al. | 211/26 |
| 6,648,149 B2 * | 11/2003 | Robertson | 211/26 |
| 6,681,942 B2 * | 1/2004 | Haney | 211/183 |
| 6,688,238 B1 * | 2/2004 | Alexiou | 108/42 |
| 6,726,164 B1 * | 4/2004 | Baiza et al. | 248/222.12 |
| 6,746,193 B1 | 6/2004 | Drake | |
| 6,749,275 B2 | 6/2004 | Cutler et al. | |
| 6,773,080 B2 | 8/2004 | Chen et al. | |
| 6,802,426 B2 * | 10/2004 | Weaver et al. | 211/192 |
| 6,854,611 B2 * | 2/2005 | Powell | 211/192 |
| 6,856,505 B1 * | 2/2005 | Venegas et al. | 361/679.05 |
| 6,871,920 B2 | 3/2005 | Greenwald et al. | |
| 6,891,727 B2 | 5/2005 | Dittus et al. | |
| 6,926,378 B2 | 8/2005 | Greenwald et al. | |
| 6,929,339 B1 | 8/2005 | Greenwald et al. | |
| 6,935,711 B1 | 8/2005 | Naue et al. | |
| 6,957,878 B2 | 10/2005 | Greenwald et al. | |
| 7,137,512 B2 | 11/2006 | Nguyen et al. | |
| 7,165,690 B2 * | 1/2007 | Wu | 211/192 |
| 7,293,667 B2 * | 11/2007 | Flynn | 211/189 |
| 2004/0173551 A1 * | 9/2004 | Wu | 211/187 |
| 2004/0217073 A1 | 11/2004 | Dobler et al. | |
| 2004/0226903 A1 * | 11/2004 | Wang | 211/187 |
| 2005/0156493 A1 | 7/2005 | Yang et al. | |
| 2005/0196230 A1 | 9/2005 | Dubon et al. | |
| 2005/0206285 A1 | 9/2005 | Greenwald et al. | |

* cited by examiner

Page Number: US 8,104,626 B2

UNIVERSAL MOUNTING BRACKET WITH SAFETY LOCK

CROSS-REFERENCE TO RELATED APPLICATION

The present application claims priority as a continuation-in-part application to U.S. application Ser. No. 11/527,329, filed Sep. 26, 2006, now U.S. Pat. No. 7,857,145 invented by Mushan Huang, et al., entitled, "Mounting Bracket for Square Hole Racks and Round Hole Racks," and assigned to Central Industrial Supply Company, of Fort Worth, Tex., the assignee of the present application.

TECHNICAL FIELD OF THE INVENTION

The present invention relates in general to mounting brackets for securing rails and drawer slides to racks and frames, and in particular to securing a tool-less mounting adapter for securing rails and drawer slides to server system racks.

BACKGROUND OF THE INVENTION

Server system racks are typically provided by either square hole racks which have square-shaped mounting holes, round hole racks which have round-shaped mounting holes, or threaded hole racks which have round threaded mounting holes. Server system racks have been used for rack mounted computer servers, telecommunication servers, power distribution units, or other electronic devices. Equipment chassis which are mounted in such server system racks are usually mounted to drawer slides which are connected to the server system racks such that the equipment chassis may then be moved linearly forward of the racks supported by the drawer slides in a cantilevered arrangement, for ease of installation and so that the equipment chassis may be easily moved forward of the racks for servicing. An innermost member of the drawer slides is mounted to each side of the equipment chassis, and is herein referred to as a chassis member. An outermost member of the drawer slides is non-movably secured to the racks, and is herein referred to as a rack member. Drawer slide members disposed between inner and outer drawer slide members, if included in the particular drawer slides, are herein referred to as intermediate members.

The rack members of the drawer slides are mounted either directly to the racks with mounting brackets, or to mounting rails formed of long strips of sheet metal which are secured to the racks by mounting brackets similar to those by which the rack members are directly mounted to the racks. Some mounting brackets for securing drawer slides to server system racks have been provided which do not require hand tools to secure the mounting brackets to the racks, rather than requiring wrenches, screw drivers, and the like. These type mounting brackets have been called tool-less mounting brackets, and are usually provided for fitting only one type of rack, either square hole racks, round hole racks, or threaded hole racks. This requires that such rail bracket hardware be specified and shipped to provide mounting brackets for fitting only one particular type of rack.

SUMMARY OF THE INVENTION

A mounting bracket is provided for securing to square hole racks, round hole racks, and threaded hole racks of the type used for server systems. The mounting bracket includes a mounting pin which is fixedly mounted to a base member for fitting in round hole racks, and a mounting sleeve is slidably extensible over the mounting pin for fitting in square hole racks. A lock pin is slidably secured to the base member, spaced apart from the mounting pin for registering with and fitting within holes of a rack. A lock sleeve is slidably secured for extending over the lock pin. The mounting pin and the mounting sleeve each have a latch tab for fitting against an outer surface of a rack. The mounting pin and the lock pin are sized with peripheries for fitting within the holes of round racks. The mounting sleeve and the lock sleeve have peripheries that are sized for fitting within the holes of square hole racks. An adapter is provided for threadingly securing to a threaded rack, and has mounting apertures of the size of the mounting holes for square hole racks for registering with and receiving the mounting sleeve and the lock sleeve to secure the adapter to the threaded hole rack. A safety lock is pivotally secured to the base member for blocking rearward movement of the lock pin when in a locked position, such that the mounting bracket can not be removed from one of the racks. A release pin is provided which extends through one of the holes of an associated rack for a user to press from a position disposed forward of the rack to move the safety lock from a locked position to a released position, without requiring a user to reach to the side of the rack.

DESCRIPTION OF THE DRAWINGS

For a more complete understanding of the present invention and the advantages thereof, reference is now made to the following description taken in conjunction with the accompanying Drawings in which FIGS. 1 through 12 show various aspects for a universal mounting bracket having a safety lock for securing to server racks, as set forth below:

DETAILED DESCRIPTION OF THE INVENTION

Figures 1, 2:
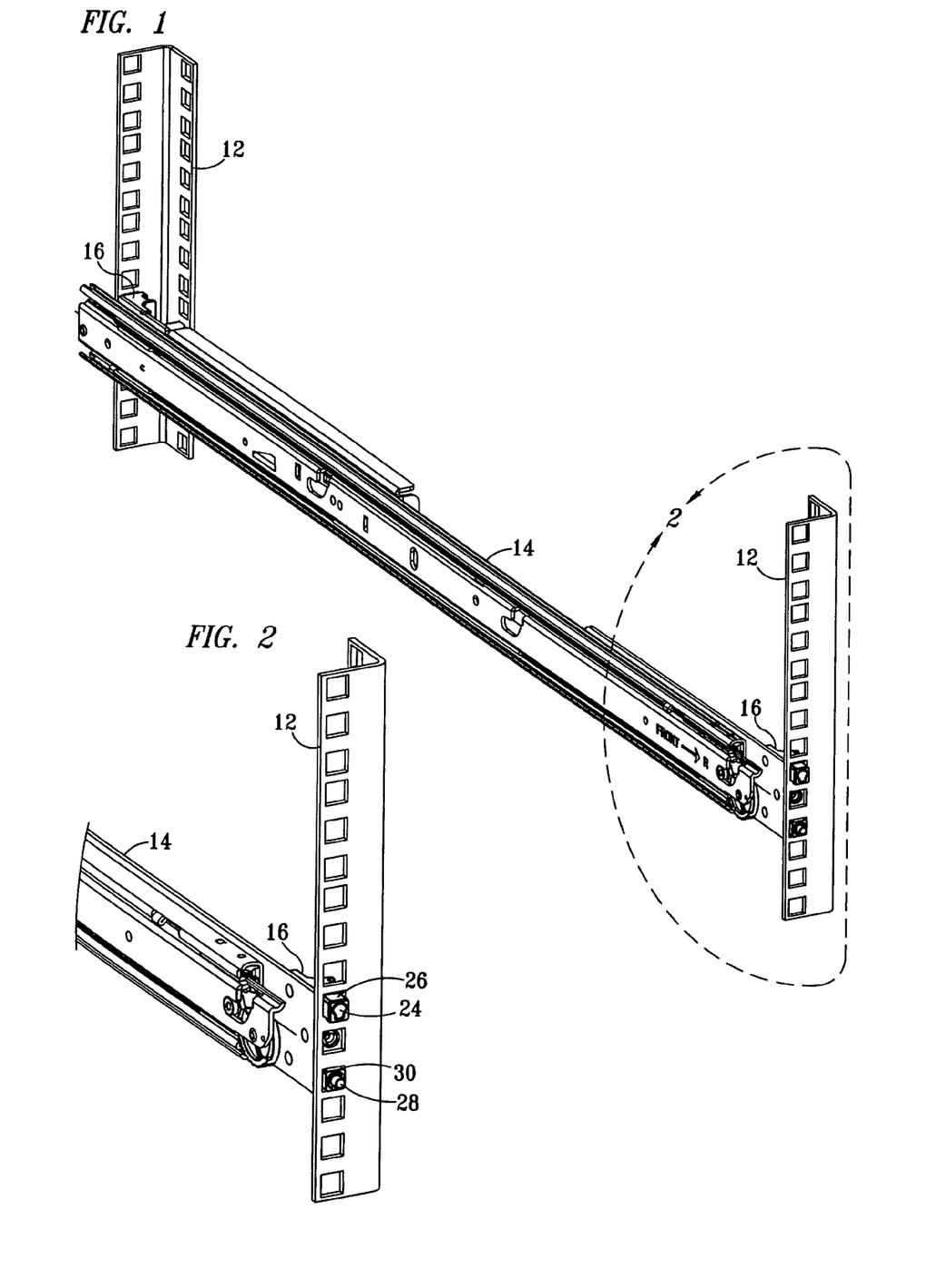
FIG. 1 is a partial perspective view of a drawer slide mounted to a square hole rack by means of the mounting bracket.
FIG. 2 is an enlarged view of an end portion of FIG. 1, showing the drawer slide mounted to the square hole rack by means of the mounting bracket.

FIG. 1 a partial perspective view of a drawer slide 14 mounted to a square hole rack 12 by means of two mounting brackets 16. The mounting brackets 16 are tool-less, such that they may be easily secured to and removed from the square hole rack 12 without use of hand tools. The drawer slide 14 extends from a forward end to a rearward end of the square hole rack 12, disposed on one side of the rack 12. One of the mounting brackets 16 is shown secured to each end of the drawer slide 14. In other embodiments, only one of the mounting brackets 16 may be provided for use on one side of the drawer slide 14, and the other side of the drawer slide may be secured to the rack 12 by adapters which are secured to the rack 12 with mechanical fasteners, or by mounting brackets of the type having fixed hook and pin type adapters. The mounting brackets 16 may be mounted directly to the drawer slide 14, or to a fixed rail which extends across one side of the rack 12. The mounting brackets 16 are preferably slidably secured to the drawer slide 14, to allow the mounting brackets 16 to be moveable relative to the drawer slide 14 for short distances for removing the mounting brackets 16 from the holes in the square hole rack 12.

FIG. 2 is an enlarged view of an end portion of FIG. 1, showing a partial perspective view of an end of the drawer slide 14, an end portion of the square hole rack 12, and the mounting bracket 16. The mounting bracket 16 has a mounting pin 24 and mounting sleeve 26 which are spaced apart from a lock pin 28 and a lock sleeve 30. The mounting sleeve 26 is extending over the mounting pin 24, and the lock sleeve 30 is extending over the lock pin 28. The mounting pin 24 and the lock sleeve 30 are spaced apart a preferred distance for registering with the square holes of the square hole rack 12. The mounting sleeve 26 extends through a first mounting hole in the square hole rack 12, and then is lowered to extend adjacent an outward side of the rack 12 to hook the mounting sleeve 26 to the rack 12. The lock sleeve 30 is then extended through a second mounting hole in the square hole rack 12 to prevent upward movement of the mounting sleeve 26, which prevents the mounting sleeve 26 from unhooking from within the first mounting hole in the square hole rack 12 to secure the mounting sleeve 26 within the second mounting hole of the square hole rack 12. An end face 54 (shown in FIG. 8) of the mounting bracket 16 fits flush against an inward side of a flange portion of the square hole rack 12, with the mounting sleeve 26 hooked to the outward side of the rack 12. The mounting bracket 16 is released from being secured to one of the racks 12 by pressing the lock pin 28 and the lock sleeve 30 rearward, such that both the lock pin 28 and the lock sleeve 30 are removed from the second mounting hole through which they were extending, and then the mounting sleeve 26 may be lifted upwards to unhook the mounting sleeve 26 from the rack 12, allowing the end tip of the mounting sleeve 26 to be removed from the second mounting hole in the rack 12.

Figures 3, 4, 5, 6:
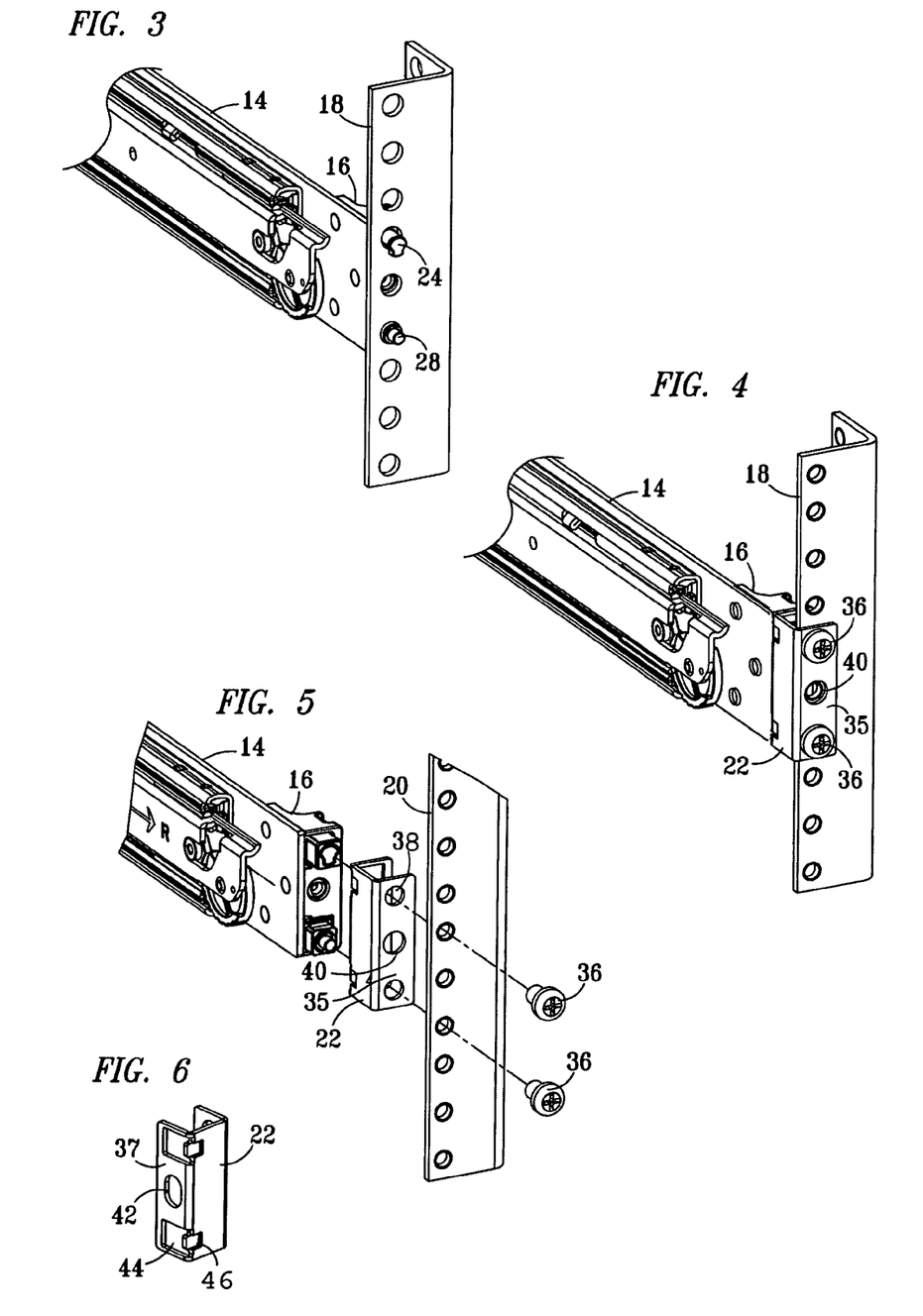
FIG. 3 is a partial perspective view of the mounting bracket securing the drawer slide to a round hole rack.
FIG. 4 is a partial perspective view of the mounting bracket and a threaded hole rack adapter securing the drawer slide to a threaded hole rack.
FIG. 5 is an exploded, partial perspective view of the mounting bracket, the threaded hole rack adapter, and the threaded hole rack of FIG. 4.
FIG. 6 is a perspective view of the threaded hole rack adapter.

FIG. 3 is a partial perspective view of an end portion of the drawer slide 14 and a round hole rack 18, showing the drawer slide 14 secured to the round hole rack 18 by the mounting bracket 16. The mounting pin 24 is shown after being moved through a first mounting hole in the round hole rack 18, and then lowered to hook the mounting bracket 16 to the rack 18, which prevents the mounting bracket 16 from being pulled from the first mounting hole in the round hole rack 18. The end face 54 (shown in FIG. 8) is fitting flush against an inward side of a flange portion of the rack 18. The mounting sleeve 26 and the lock sleeve 30 are too large to fit into the holes of the round hole rack 18. The mounting pin 24 and the lock pin 28 are spaced apart for registering with two spaced apart holes in the round hole rack 18. The lock pin 28 has been inserted into a second mounting hole in the round hole rack 18, after the mounting pin 24 is hooked to the round hole rack 18. The lock pin 28 is sized for fitting within the second mounting hole in the round hole rack 18, and preventing upward movement of the mounting pin 24 within the first mounting hole, such that the mounting pin 24 remains hooked to the round hole rack 18. The mounting bracket 16 is released from being secured to the rack 18 by first pressing the lock pin 28 rearward, such that the lock pin 28 is removed from the second mounting hole in the rack 18, and then lifting the mounting pin 24 upwards to unhook the mounting pin 24 from the rack 18 by aligning the end tip of the mounting pin 24 with the first hole. The mounting pin 24 is then moved rearward and withdrawn from the first hole in the rack 18. Preferably, the mounting pin 24 is fixed in position relative to a main body of the mounting bracket 16. For such embodiments, the mounting bracket 16 is slidably mounted to the drawer slide 14, such that the mounting bracket 16 slides for a short distance relative to the longitudinal length of the drawer slide 14 for removing the mounting pin 24 from within the first hole in the threaded hole rack 18 when the opposite end of the drawer slide is mounted in a fixed relation to the rack 18.

FIGS. 4, 5 and 6 are perspective views of the mounting bracket 16, a threaded hole rack 20, and an adapter 22 for securing the mounting bracket 16 to the threaded hole rack 20. FIG. 4 is a partial perspective view of the drawer slide 14 secured to a threaded hole rack 20 by means of the mounting bracket 16 and the threaded hole rack adapter 22. FIG. 5 is an exploded, partial perspective view of the drawer slide 14, the mounting bracket 16, the threaded hole rack adapter 22 and the threaded hole rack 20. FIG. 6 is a perspective view of the threaded hole rack adapter 22. The threaded hole rack adapter 22 has a U-shaped cross section, with a forward flange 35 and a rearward flange 37. Two through holes 38 are defined in spaced apart relation in the forward flange 35 for registering with two spaced apart holes in the threaded hole rack 20. A release pin hole 40 is provided in the forward flange 35, preferably between the two through holes 38, such that the release pin hole 40 registers with one of the holes in the threaded hole rack 20 which is disposed between the holes in the threaded hole rack 20 which register with the through holes 38 in the threaded rack adapter 22. Two mounting apertures 44 are provided in the rearward flange 37. The two mounting apertures 44 are spaced apart, preferably on opposite sides of a release pin hole 42. The two mounting apertures 44 are spaced apart for registering with the mounting sleeve 26 and the lock sleeve 30 of the mounting bracket 16. The release pin hole 42 is aligned with the release pin hole 40 in the forward flange 35 for registering with a threaded mounting hole of the rack 20. Two alignment tabs 46 are provided for extending adjacent the inward side of the mounting bracket 16, fitting flush against an inward side of the base member 50 which is opposite of an outer side of the base member 50 to which the cover 52 is mounted. Preferably, the mounting apertures 44 are of the size and shape of the square holes of the square holes rack 12 (shown in FIG. 2).

The forward flange 35 is secured to an outward side of the threaded hole rack 20 by two threaded fasteners 36. The mounting bracket 16 is secured to the rearward flange 37 of the adapter 22, which secures the drawer slide 14 to the threaded hole rack 20. The mounting bracket 16 is preferably secured to the rack 20 by first mounting the rack adapter 22 to the threaded hole rack 20 by means of the threaded fasteners 36. Then, the mounting sleeve 26 is passed through one of the square shaped mounting apertures 44 of the adapter 22, and the mounting bracket 16 is lowered, or moved in a direction toward the aperture 44 through which the lock sleeve 30 will extend, to hook the mounting sleeve 26 to the adapter 22. The mounting bracket 16 is released from being secured to the rack 20 by first pressing the lock pin 28 and the lock sleeve 30 rearward, such that the lock pin 28 and the lock sleeve 30 no longer extend through the mounting aperture 44 in the adapter 22, and then the mounting sleeve 26 is moved upward to unhook the mounting sleeve 26 from the rack adapter 22 and the rack 20, allowing the end tip of the mounting sleeve 26 to be removed from the hole 44 in the adapter 22 through which it extends. Preferably, the mounting pin 24 is fixed in relative position to a main body of the mounting bracket 16, such that the mounting bracket 16 is preferably mounted to the drawer slide 14 for allowing movement of the mounting bracket 16 for least short distances along the longitudinal length of the drawer slide 14.

Figure 7:
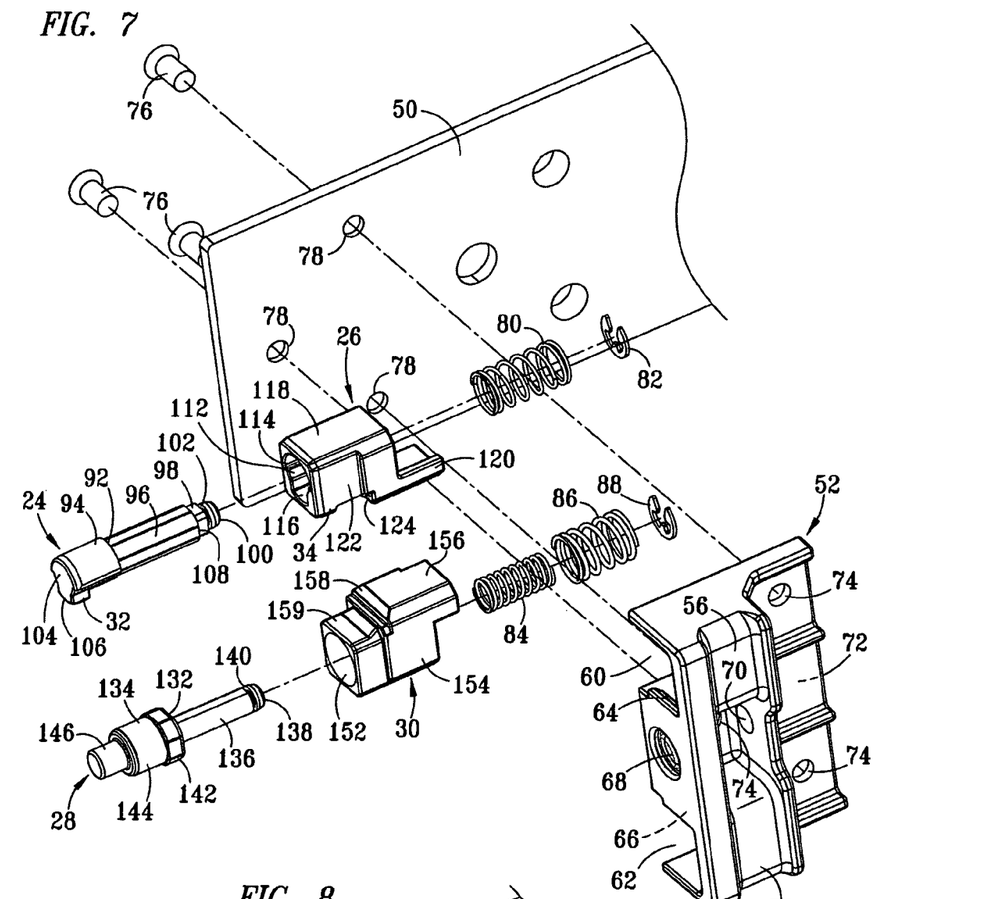
FIG. 7 is an exploded view of the mounting bracket.
Figure 8:
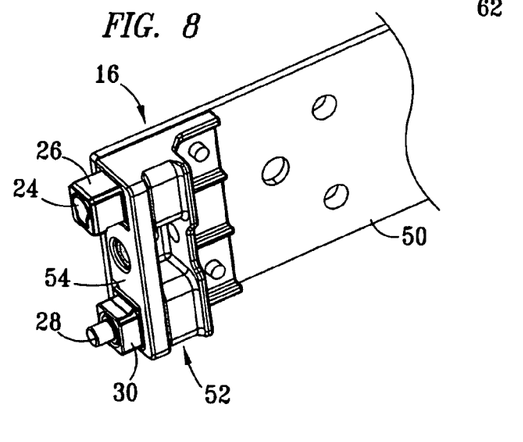
FIG. 8 is an assembled view of the mounting bracket.

FIG. 7 is an exploded view and FIG. 8 is an assembled view of the mounting bracket 16. The mounting bracket 16 has a base member 50 and a cover 52, which provide the main body for the mounting bracket 16. The base member 50 is preferably mounted to the drawer slide 14 by means of one or more slots (not shown) which extend longitudinally relative to the base member 50 for receiving mechanical fasteners to allow the base member 50 to slidably move short distances relative to the drawer slide 14. The mounting pin 24 is preferably mounted in fixed relative position to the base member 50 and the cover 52, such that moving the mounting bracket 16 relative to the drawer slide 14 facilitates removal of the mounting pin from within a mounting hole of a rack or the round hole rack adapter 22 when an opposite end of the drawer slide is mounted in fixed relation to the rack. The cover 52 is secured to the base member 50 by rivets 76. The cover 52 defines an end face 54 having front openings 60 and 62 for receiving the mounting sleeve 26 and the lock sleeve 30. A release pin aperture 68 also extends into the end face 54. The end face 54 fits flush against a planar mating surface provided by a flange of one of the racks 12, 18 and 20.

The cover 52 and the base member 50 define a housing having two guide channels 56 and 58. The guide channel 56 slidably receives the mounting sleeve 26, and the guide channel 58 slidably receives the lock sleeve 30. Stops 64 and 66 are provided by protrusions which extend from the edges of respective ones of the channels 56 and 58, interiorly into the guide channels 56 and 58 for engaging the mounting sleeve 26 and the lock sleeve 30 to prevent removal of the mounting sleeve 26 and the lock sleeve 30 through the front openings 60 and 62, respectively. The release pin aperture 68 and a release pin aperture 70 are also provided in the cover 52, aligned in registration for slidably receiving a release pin 182 (shown in FIG. 10). A side of the cover 52 defines a flat surface 72 for mounting flush against the planar surface of the base member 50. Mounting holes 78 are provided in the base member 50 and mounting holes 74 are provided in the cover 52 for receiving rivets 76. Preferably, there are three each of the mounting holes 74 and 78, and the rivets 76. A bias spring 80 is provided by a coil spring which extends into an end of the mounting sleeve 26 for urging the mounting sleeve 26 to extend outward of the guide channel 56 and through the front opening 60. A snap ring fastener 82 is provided for securing the mounting pin 24 in fixed relation to the base member 50 and the cover 52. A bias spring 86 is provided for fitting into the rearward end of the lock sleeve 30 and urging the lock sleeve 30 to extend outward of the guide channel 58 and through the front opening 62. A bias spring 84 preferably extends interiorly within the bias spring 84 for urging the lock pin 28 to extend outward of the guide channel 56 and through the front opening 62. A snap ring 88 provides a fastener for securing the lock pin 28 from removal against the mounting bracket 16.

The mounting pin 24 provides a mounting member which preferably has an elongate body 92 with a head 94 on forward end and a shank 96 on a rearward end. The outward end of the head 94 of the mounting pin 24 is of a cross-sectional shape having an upper, enlarged portion 104 and a lower, tapered portion 106, which is of a smaller dimension than the enlarged portion 104. A tab 32 is defined by a protuberance which extends radially outward from the head 94, preferably in a downward direction, transverse to a length of the mounting pin 24 for passing through a round hole in the rack 18 and dropping downward with the mounting pin 24 to extend the tab 32 along an adjacent outer portion of the rack 18 and hook the mounting pin 24 to the rack 18. The mounting pin 24 must then be lifted to align the tab 32 for passing through the mounting hole in the rack 18 and removing the mounting pin 24 from the rack 18. The lock pin 28 prevents lifting of the mounting pin 24 for removal from the rack 18. The shank 96 has a rearward end portion formed to have a square-shaped periphery 98, which provides a keyed end for the shank 96, which fits within a square-shaped opening 166 in the cover 52 (shown in FIG. 11) to prevent the mounting pin 24 from rotating relative to the cover 52. A rearward end tip portion 100 of the mounting pin 24 has a snap ring groove 102 formed therein for receiving the snap ring 82. A shoulder 108 defines an annular-shaped stop which fits against a surface of the cover 52, which in conjunction with the snap ring 82, secures the mounting pin 24 to the cover 52 such that it is in fixed relation to the cover 52.

The mounting sleeve 26 provides a mounting member having a guide opening 112 for slidably receiving and extending over the head 94 of the mounting pin 24. The guide opening 112 has an enlarged portion 114 and a tapered portion 116 for receiving the enlarged portion 104 and the tapered portion 106 of the head 94 of the mounting pin 24, respectively. The profile, or shape, of the enlarged portion 114 and the tapered portion 116 of the guide opening 114 matches the shape of the periphery of the enlarged portion 104 and the tapered portion 106 of the mounting pin 24, to provide a keyed arrangement which prevents rotation of the mounting pin 24 relative to the mounting sleeve 26. The mounting sleeve 26 has a central body portion 118 having a guide boss 120 defined by a protuberance of L-shaped cross-section which extends rearward from the central body portion 118 for fitting within a guide slot 162 in the cover 52 (shown in FIG. 11). The mounting sleeve 26 further has a forward portion 122 having a periphery for snugly fitting within the square holes of square hole racks 12, with clearance for the latch tab 32 to be raised and moved through a mounting hole of the square hole rack 12. A stop shoulder 124 is provided for engaging the stop 64 of the guide channel 56 adjacent the front opening 60 in the cover 52, to prevent removal of the mounting sleeve 26 from within the guide channel 56. A latch tab 34 is defined by a protrusion which extends radially outward from the forward end of the sleeve 26, preferably in a downward direction, transverse to the length of the mounting sleeve 26 for passing through a square hole in the rack 12 and along an outward side of a rack to hook the mounting sleeve 26 to the rack 12. The mounting sleeve 26 must then be lifted to align the latch tab 34 for passing through the hole in the rack 12 and removing the mounting sleeve 26 from the rack 12.

The lock pin 28 provides a lock member having a pin body 132 which includes a head 134 and a rearwardly extending shank 136. The shank 136 has an end 138 which passes through an opening 172 and the cover 52 (shown in FIG. 11) and has a snap ring groove 140 for receiving the snap ring 88. The head 134 has an enlarged portion 142, a forward engagement portion 144 and a release tip 146. The engagement portion 144 snugly fits within the round holes of a round hole rack 18. The release tip 146 extends forward of the engagement portion 144 for a person to press against the release tip 146 to push the lock pin 28 from within a hole of the round hole rack 18 and back into the cover 52 of the mounting bracket 16 to allow the mounting pin 24 to be removed from the rack 18.

The lock sleeve 30 provides a lock member having an opening 152 for slidably receiving the head 134 of the lock pin 28. The lock sleeve 30 has a central portion 154 and a guide boss 156 which provides a rearwardly extending protuberance having flat shaped, or planar, surfaces, and an L-shaped cross-section. The guide boss 156 extends within a guide slot 164 of the cover 52 (shown in FIG. 1). A stop 158 is defined by a shoulder extending between the central portion 154 and a forward portion 159 of the lock sleeve 30. The forward portion 159 preferably has a periphery for snugly fitting within a square hole of the square hole rack 12.

To accommodate the differences in mounting hole spacing between square hole racks 12 and round hole racks 18, exterior engagement surfaces of the mountings sleeve 26 and the lock sleeve 30 are offset from the engagement surfaces of the mounting pin 24 and the lock pin 28 which engage within the mounting holes of round hole racks 18. That is, exterior surfaces which engage within the mounting holes of the racks 18 and 12 for the head 94 of the mounting pin 24, the engagement portion 144 of the lock pin 28, the forward portion 122 of the mounting sleeve 26, and the forward portion 159 of the lock sleeve 30 define respective geometric centroidal center lines which extend longitudinally along the length of the pins 24 and 28, and the sleeves 26 and 30, respectively. The spacing between such center lines for the head 94 of the mounting pin 24 and the engagement portion 144 of the lock pin 28 are determined such that the mounting pin 24, the lock pin 28 and the release pin aperture 68 register with the mounting holes in round hole racks 18, for fitting in corresponding holes in the rack 18. Similarly, the spacing between the longitudinally extending, geometric centroidal center lines for the forward portion 122 of the mounting sleeve 26 and the forward portion 159 of the lock sleeve 30 are determined such that the mounting sleeve 26, the lock sleeved 30 and the release pin aperture 68 register with the mounting holes in square hole racks 12, for fitting in respective holes.

Figure 10:
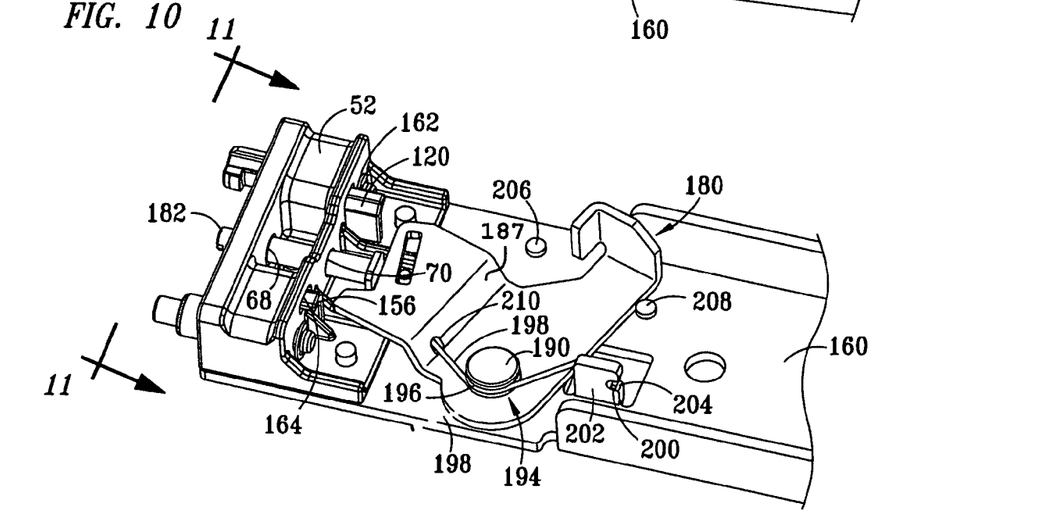
FIG. 10 is an assembled view of the safety lock and the mounting bracket, showing the safety lock in a released position.
Figure 11:
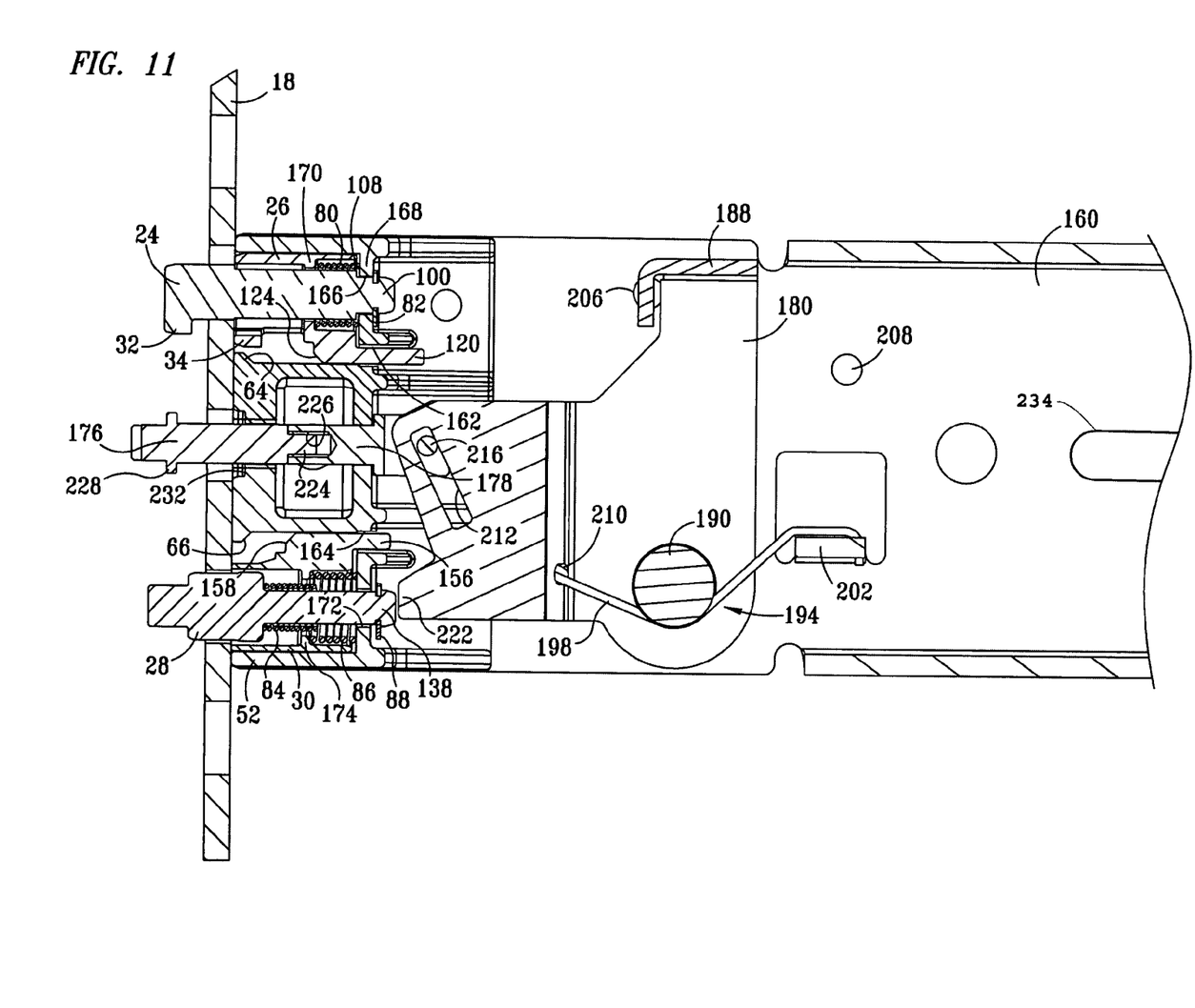
FIG. 11 is a sectional view of the safety lock and the mounting bracket, taken along section line 11-11 of FIG. 10, and showing the safety lock after being moved from the released position to a locked position.

FIG. 11 is a sectional view of the mounting bracket 16 and a safety lock 180, taken along section line 11-11 of FIG. 10, and shows the safety lock in a released position. The cover 52 has a first guide slot 162 for receiving the guide boss 120 of the mounting sleeve 26, and a second guide slot 164 for receiving the guide boss 156 of the lock sleeve 30. A square-shaped opening 166 is provided for receiving the square-shaped periphery 98 of the rearward end of the mounting pin 24, such that the profile of the opening 166 and the periphery 98 are mating shapes which provide a keyed arrangement to prevent rotation of the mounting pin 24 relative to the cover 52. The mounting sleeve 26 has flat sides, having a cross-section of a polygonal shape, which is preferably square, and the guide channel 56 has sidewalls of a mating shape to preventing rotation of mounting sleeve 26 relative to the cover 52. Similarly, the lock sleeve 30 is of a polygonal shape, preferably square or rectangular, and the guide channel 58 has a mating shape which prevents relative rotation of the lock sleeve 30 relative to the cover 52. A tab 168, in which the opening 166 is defined, defines a shoulder for extending into the guide channel 56 to provide a rearward stop for engaging the stop shoulder 108 on the rearward end 100 of the mounting pin 24. A tab 170 extends inwardly into the guide opening 112 of the mounting sleeve 26 and provides a shoulder, or stop, for engaging rearward end of the head 94 of the mounting pin 24 as the mounting sleeve 26 extends forward and outward of the guide channel 56 of the cover 52. The bias spring 80 presses between the tab 170 and the tab 168. An opening 172 is provided within the cover 52 for receiving the shank 136 of the lock pin 28. The tab 174 is annular shaped and extends interiorly within the lock sleeve 30 for engaging a forward end of the bias spring 86. A rearward end of the bias spring 86 engages a shoulder defined by a portion of the cover 52 located adjacent to the opening 172. The bias spring 84 extends between rearward end of the head 134 of the lock pin 28 and the shoulder defined by a portion of the cover 52 located adjacent to the opening 172. The bias spring 84 is shown in a compressed state in FIGS. 11 and 12, to more clearly show the bias spring 86.

Figure 9:
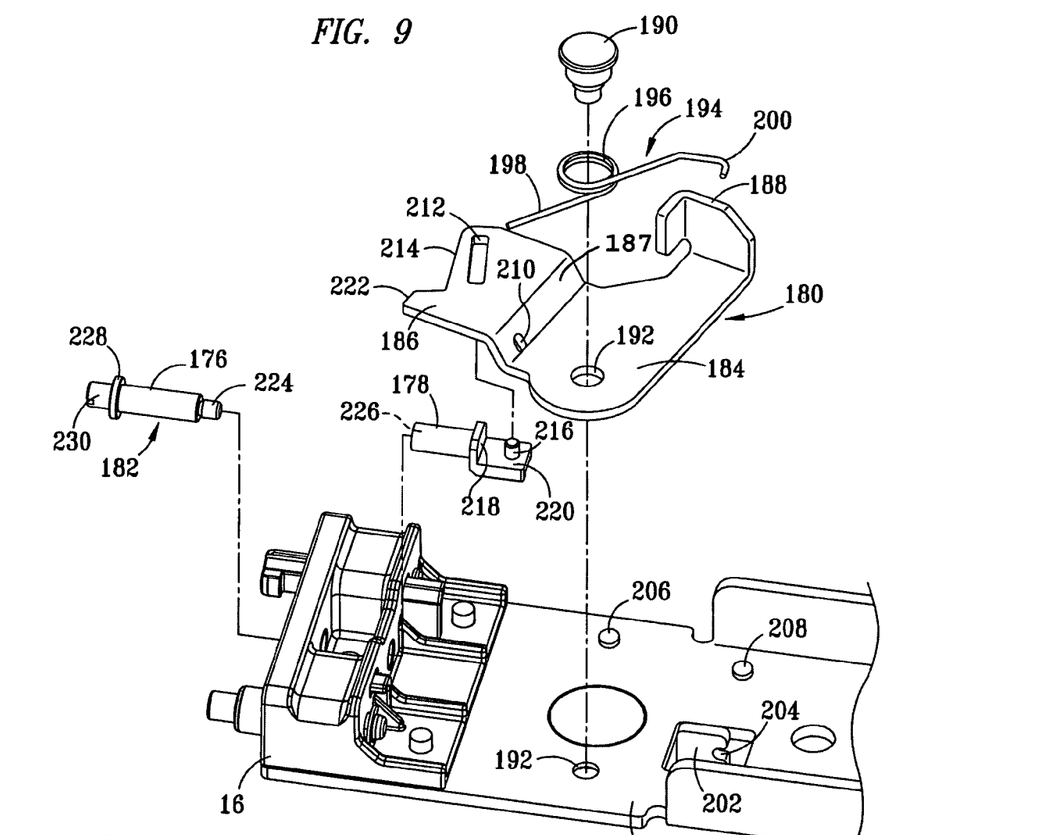
FIG. 9 is an exploded view of a safety lock for use with the mounting bracket.

FIG. 9 is an exploded view of a safety lock 180 and the mounting bracket 16, and FIG. 10 is an assembled view showing the safety lock 180 assembled to the mounting bracket 16. The safety lock 180 prevents the lock pin 28 from being pushed rearward when the mounting bracket 16 is secured to one of the racks 12, 18 and 20. The base member 50 of FIGS. 7 and 8 has been replaced with the base member 160. Preferably, the base member 160 has at least one longitudinally extending slot 234 (shown in FIGS. 11 and 12) for securing to the slide rail 14, such that the base member 160 is slidably movable for removing the lock pin 24 from a mounting hole of a rack. A release pin 182 is provided by a press pin which provides for release of the safety lock 180 for a person to use from a position forward of the mounting adapter 16. The safety lock 180 also has a thumb release tab 188, which a user may access by reaching behind the mounting adapter 16 when the drawer slide 14 is extended. The safety lock 180 has a first portion 184 and a second portion 186, with a joggle 187 between the first portion 184 and the second portion 186. The first portion 184 fits flush against the side of the base member 160 in sliding engagement therewith. The second portion 186 is raised from the surface of the first portion 184, for extending adjacent the cover 52. A rivet 190 passes through rivet holes 192 in the first portion 184 of the safety lock 180 and the base member 160 to pivotally secure the safety lock 180 to the base member 160 with the first portion mating flush against and slidably moveable relative to a side of the base member 160, for rotating the safety lock 180 relative to the base member 160. A bias spring 194 is provided by a torsion spring having a central portion 196 which is coiled, and ends 198 and 200. The end 198 of the bias spring 194 engages within a hole 210 formed in the joggle 187 between the first portion 184 and the second portion 186. The end 200 of the bias spring 194 is secured into an edge slot 204 formed into a lance tab 202, which extends from the base member 160. Two stops 206 and 208 extend upward from a surface of the base member 160 for engaging forward and rearward ends of the first portion 184 of the safety lock 180. The stop 206 is provided by a protuberance defining a tab which stops rotation of the safety lock 180 when disposed in a locked position, shown in FIG. 11. The stop 208 is defined by a protuberance defining a tab which engages an edge of the first portion 184 of the safety lock 180 when disposed in a released position, shown in FIGS. 10 and 11.

A release pin slot 212 is defined in the second portion 186 of the safety lock 180. The release pin slot 212 extends parallel to a forward edge 214 of the second portion 186 of the safety lock 180. The edge 214 is formed to prevent interference of the forward edge 214 of the safety lock 180 with the release pin 182. The safety lock 180 also has a lock portion 222 defined by a shoulder which is disposed adjacent the rearward end 138 of the lock pin 28 to prevent rearward movement of the lock pin 28 when disposed within one of the holes of the racks 12, 18 and 20. The release pin 182 has a first portion 176 and a second portion 178. A protuberance 216 defines a tab which extends upward for fitting within the release pin slot 212. The release pin slot 212 is disposed at a longitudinal angle such that it provides a cam surface for engaging with the protuberance 216 to urge rotation of the safety lock 180 from the locked position (shown in FIG. 1) to the release position (shown in FIGS. 10 and 12). The second portion 178 of the release pin 182 extends with a rearward member 220 from which the protuberance 216 upwardly extends. A flange 218 extends downward from a center line of the release pin 182. The forward end 176 of the release pin has a release tip 230 and a circumferentially extending protrusion which provides an annular shaped boss 228. The annular shaped boss 228 engages an annular shaped stop shoulder 232 (shown in FIG. 11) of the cover 52. The rearward end of the first portion 176 of the release pin 182 has a tip 224 for press fitting in a hole 226 in the forward end of the second portion 178 of the release pin 182, to secure the first portion 176 to the second portion 178 within the mounting bracket 16.

Figure 12:
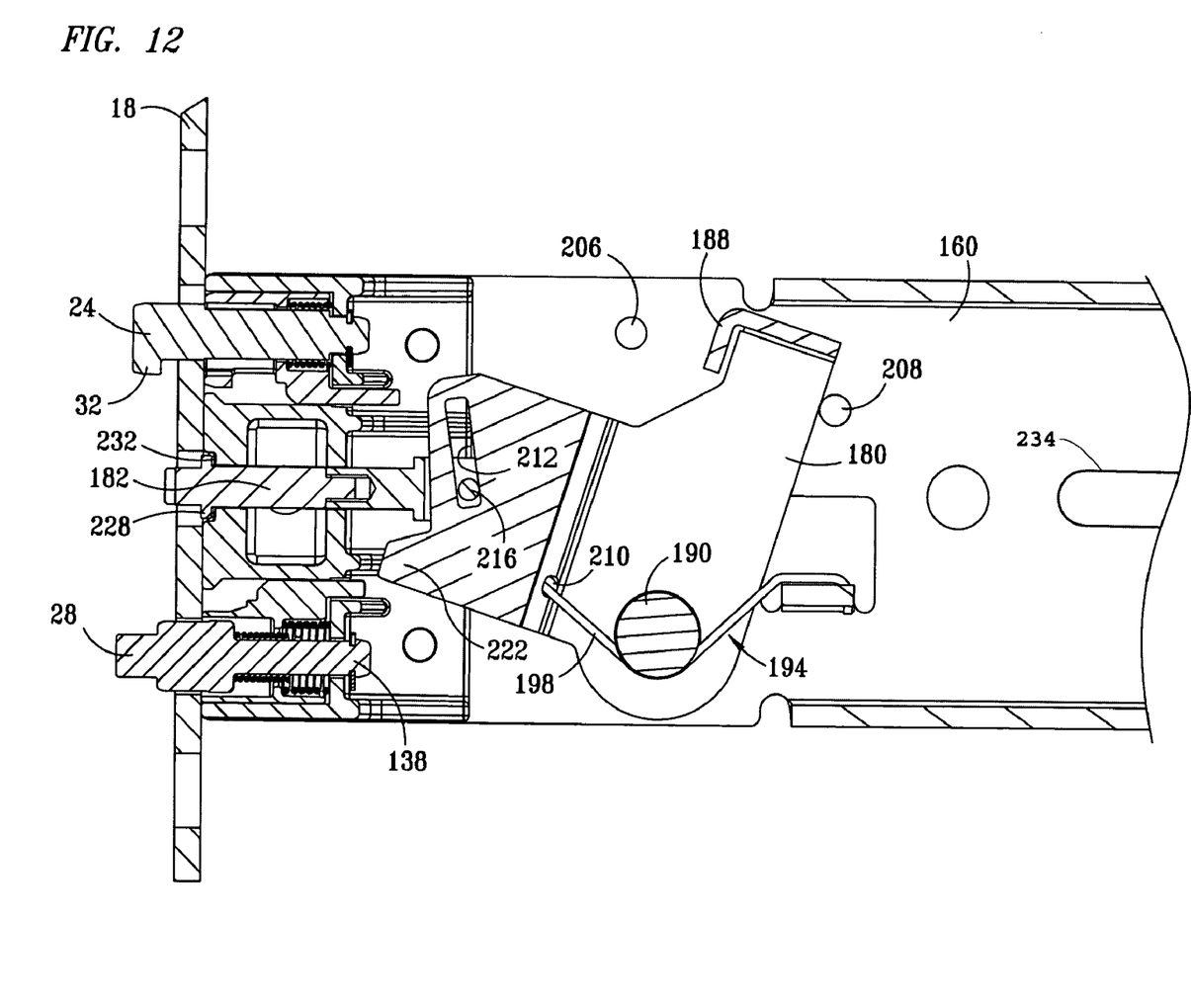
FIG. 12 is a sectional view of the safety lock and the mounting bracket, taken along section line 10-10 of FIG. 11, and showing the safety lock in a released position.

FIGS. 11 and 12 are sectional views of the mounting bracket 16 and the safety lock 180 taken along section line 11-11 of FIG. 10. FIG. 11 shows the safety lock 180 disposed in a locked position, with the lock shoulder 222 disposed adjacent the rearward end 138 of the lock pin 28. The release pin 182 extends through one of the holes in the round hole rack 18. In FIG. 12, the release pin 182 has been pushed rearward such that the protuberance 216 has pressed against the edges of the guide slot 212 to urge the safety lock 180 to rotate clockwise, from the locked position shown in FIG. 11 to the release position shown in FIG. 12, such that the lock shoulder 222 has been removed from being disposed adjacent to the rearward end 138 of the lock pin 28. The lock pin 28 is then pressed rearward from within the respective mounting hole in the rack 18, such that the mounting pin 24 may be lifted to align the latch tab 32 for passing through the corresponding hole in the round hole rack 18 through which the mounting pin 24 extends. The slot 234 extends for slidable securing the mounting bracket 16 to the drawer slide 14.

In other embodiments of the present invention, a mounting adapter for threaded hole racks may be provided which is similar to the threaded hole rack adapter 22, except that round-shaped through holes of the size of mounting holes for round hole rack 18 are provided for adapter mounting holes to secure the pins 24 and 28, rather than the square-shaped holes 44 used for securing the sleeves 26 and 30. Additionally, the mounting pin 24 and the mounting sleeve 26 may be provided by a single, unitary member having a first portion of one diameter for fitting in round hole racks and a second adjacent portion of a larger diameter, disposed adjacent to and rearward of the first portion, for fitting in square hole racks, with the single member extendable from a base member and cover. Similarly, the lock pin 28 and the lock sleeve 30 may be provided by a single, unitary member, having a first portion of one diameter for fitting in round hole racks and a second portion, rearward of the first portion, for fitting in square hole racks. The geometric centroidal center lines of the first and second portions of the respective mounting member and lock member would be offset, as noted above, for accommodating the different spacings for square hole racks 12 and round hole racks 18.

The present invention provides advantages over prior art mounting adapters. A mounting sleeve is slidably secured over a mounting pin in a keyed configuration, preventing rotation of the mounting sleeve relative to the mounting pin and relative to a base member for the mounting adapter. A lock sleeve is slidably secured over a lock pin. The lock sleeve and the lock pin are configured in spaced apart alignment with the mounting sleeve and the mounting pin, respectively, for registering with the respective holes of square hole racks and round hole racks. An adapter is provided for using the mounting bracket with threaded hole racks, having a first end secured to the threaded hole rack and a second end to which a mounting sleeve and lock sleeve are secured. A safety lock is provided for securing the lock pin in a rack hole, preventing removal of the mounting bracket from a rack. A release pin is aligned with the mounting pin, the mounting sleeve, the lock pin and the lock sleeve for registering with a rack mounting hole, and extending through the mounting hole and through the mounting bracket for engaging the safety lock to move the safety lock aside of the lock pin, such that the mounting bracket may be removed from a rack.

Although the preferred embodiment has been described in detail, it should be understood that various changes, substitutions and alterations can be made therein without departing from the spirit and scope of the invention as defined by the appended claims.

What is claimed is:

1. A mounting bracket for securing to a rack, said mounting bracket comprising:
 a base member;
 a mounting member adapted for extending from said base member and fitting in a first mounting hole in the rack, said mounting member having a first tab which extends transversely to a length of said mounting member; wherein said first tab extends adjacent to a side of said rack for hooking said mounting member within the first mounting hole;
 a lock member moveably mounted to said base member for extending outward from said base member and fitting within a second mounting hole in the rack, wherein said lock member is adapted for fitting within said second mounting hole and preventing removal of said mounting member from within the first mounting hole in said rack; and
 a safety lock moveably mounted to said base member for selectively moving between a locked position and a released position, wherein said safety lock when located in said locked position is disposed adjacent to said lock member and prevents removal of said lock member from within said second hole and when located in said released position is disposed aside of said lock member to allow removal of said lock member from within said second hole.

2. The mounting bracket according to claim 1, wherein said safety lock comprises:
 a first portion which is pivotally secured to said base member for angularly moving between said locked position and said released position; and
 a second portion extending in fixed relation to said first portion, and having a lock shoulder which is disposed adjacent said at least one lock member when said safety lock is disposed in said locked position and moved aside of said at least one lock member when said safety lock is disposed in said released position.

3. The mounting bracket according to claim 2, where said first portion and said second portions extend in parallel alignment, spaced apart with a joggle there-between, with said second portion spaced further from said base member than said first portion.

4. The mounting bracket according to claim 2, further comprising a torsion spring for urging said safety lock into said locked position.

5. The mounting bracket according to claim 4, wherein a first end of said torsion spring engages a tab extending from said base member and a second end of said torsion spring engages said joggle between said first and second portions of said safety lock.

6. The mounting bracket according to claim 1, further comprising a release pin which extends from a forward end of said base member to said safety lock, with said release pin aligned for registering in one of the mounting holes of the rack, such that said release pin may be pressed from forward of the mounting bracket to move said safety lock from said locked position to said released position.

7. The mounting bracket according to claim 6, wherein a release pin slot is formed in a forward portion of said safety lock, aligned for receiving a protuberance from said release pin such that movement of said release pin in a rearward direction moves said safety lock from said locked position to said released position.

8. The mounting bracket according to claim 1, further comprising a threaded hole rack adapter, said threaded hole rack adapter having a first portion for receiving a threaded fastener to secure said threaded hole rack adapter to said threaded hole rack, and a first and a second mounting holes, the first mounting hole for receiving said mounting member, and said second mounting hole for receiving said at least one lock member.

9. The mounting bracket according to claim 8, further comprising a mounting pin and a mounting sleeve, said mounting pin sized for fitting within round mounting holes of a round hole rack with a mounting pin tab fitting against an outward side of the round hole rack, and said mounting sleeve is moveably secured to said bracket body for extending over said mounting pin, wherein said mounting sleeve is sized for fitting within square mounting holes of a square hole rack and having a mounting sleeve tab for passing through the square mounting holes and engaging against an outward side of the square hole racks, wherein said mounting member comprises one of said mounting pin and said mounting sleeve and said first tab comprises one of said mounting pin tabs and said mounting sleeve tabs.

10. A mounting bracket for securing to square hole racks and round hole racks, comprising:
   a base member;
   a mounting pin mounted extending from said base member, said mounting pin sized for fitting within round mounting holes of the round hole racks, and having a first tab for passing through the round mounting holes and fitting against an outward side of the round hole racks;
   a mounting sleeve moveably mounted to said bracket body for extending over said mounting pin, wherein said mounting sleeve is sized for fitting within square mounting holes of the square hole racks and having a second tab for passing through the square-shaped holes and engaging against the outward side of the square hole racks;
   a first bias member mounted to said base member and extending between said base member and said mounting sleeve for urging said mounting sleeve to extend over said mounting pin; and
   at least one lock member mounted to said base member for extending outward from said base member and fitting within one of the round holes of a round hole rack of one of the square holes of a square hole rack for preventing removal of one of the mounting pin from the round hole of a round hole rack and the square hole of a square hole rack;
   a safety lock pivotally secured to the base member, rearward of said at least one lock member, for moving between a locked position and a released position, wherein said safety lock when located in said locked position is disposed adjacent said at least one lock member and prevents removal of said at least one lock member from a respective one of the round holes of a round hole rack and the square holes of the square hole rack, and when said safety lock when located in said released position is disposed aside of said at least one lock member to allow removal thereof from a respective one of said round holes and said square holes; and
   a bias member for urging said safety lock into said locked position.

11. The mounting bracket according to claim 10, wherein said safety lock comprises:
   a first portion which is pivotally secured to said base member for angularly moving between said locked position and said released position; and
   a second portion extending in fixed relation to said first portion, and having a lock shoulder which is disposed adjacent said at least one lock member when said safety lock is disposed in said locked position and moved aside of said at least one lock member when said safety lock is disposed in said released position.

12. The mounting bracket according to claim 11, where said first portion and said second portions extend in parallel alignment, spaced apart with a joggle there-between, with said second portion spaced further from said base member than said first portion.

13. The mounting bracket according to claim 12, wherein said bias member comprises a torsion spring having a first end which engages a tab extending from said base member, and a second end which engages said joggle between said first and second portions of said safety lock.

14. The mounting bracket according to claim 10, further comprising a release pin which extends from a forward end of said base member to said safety lock, with said release pin aligned for registering in one of said round holes of the round hole rack and said square holes of the square hole rack, such that said release pin may be pressed from forward of the mounting bracket to move said safety lock from said locked position to said released position.

15. The mounting bracket according to claim 14, wherein a release pin slot is formed in a forward portion of said safety lock, aligned for receiving a protuberance from said release pin such that movement of said release pin in a rearward direction moves said safety lock from said locked position to said released position.

16. The mounting bracket according to claim 15, further comprising a threaded hole rack adapter, said threaded hole rack adapter having a first portion for receiving a threaded fastener to secure said threaded hole rack adapter to said threaded hole rack, and a first and a second mounting holes, the first mounting hole for receiving one of said mounting sleeve and said mounting pin, and said second mounting hole for receiving said at least one lock member.

17. A mounting bracket for securing to square hole racks and round hole racks, comprising:
   a base member;
   a mounting pin mounted extending from said base member, said mounting pin sized for fitting within round mounting holes of the round hole racks, and having a first tab for passing through the round mounting holes and fitting against an outward side of the round hole racks;
   a mounting sleeve moveably mounted to said bracket body for extending over said mounting pin, wherein said mounting sleeve is sized for fitting within square mounting holes of the square hole racks and having a second tab for passing through the square-shaped holes and engaging against the outward side of the square hole racks;

a first bias member mounted to said base member and extending between said base member and said mounting sleeve for urging said mounting sleeve to extend over said mounting pin; and at least one lock member mounted to said base member for extending outward from said base member and fitting within one of the round holes of a round hole rack of one of the square holes of a square hole rack for preventing removal of one of the mounting pin from the round hole of a round hole rack and the square hole of a square hole rack;

a safety lock pivotally secured to the base member, rearward of said at least one lock member, for moving between a locked position and a released position, wherein said safety lock when located in said locked position is disposed adjacent said at least one lock member and prevents removal of said at least one lock member from a respective one of the round holes of a round hole rack and the square holes of the square hole rack, and when said safety lock when located in said released position is disposed aside of said at least one lock member to allow removal thereof from a respective one of said round holes and said square holes;

said safety lock having a first portion and a second portion, said first portion pivotally secured to said base member for angularly moving between said locked position and said released position, and said second portion extending in fixed relation to said first portion and having a lock shoulder which is disposed adjacent said at least one lock member when said safety lock is disposed in said locked position and moved aside of said at least one lock member when said safety lock is disposed in said released position;

a bias member for urging said safety lock into said locked position; and a release pin which extends from a forward end of said base member to said safety lock, with said release pin aligned for registering in one of said round holes of the round hole rack and said square holes of the square hole rack, such that said release pin may be pressed from forward of the mounting bracket to move said safety lock from said locked position to said released position.

18. The mounting bracket according to claim 17, wherein said first portion and said second portions of said safety lock extend in parallel alignment, spaced apart with a joggle therebetween, with said second portion spaced further from said base member than said first portion; and wherein said bias member comprises a torsion spring having a first end which engages a tab extending from said base member, and a second end which engages said joggle between said first and second portions of said safety lock.

19. The mounting bracket according to claim 18, wherein a release pin slot is formed in a forward portion of said safety lock, aligned for receiving a protuberance from said release pin such that movement of said release pin in a rearward direction moves said safety lock from said locked position to said released position.

20. The mounting bracket according to claim 19, further comprising a threaded hole rack adapter, said threaded hole rack adapter having a first portion for receiving a threaded fastener to secure said threaded hole rack adapter to said threaded hole rack, and a first and a second mounting holes, the first mounting hole for receiving one of said mounting sleeve and said mounting pin, and said second mounting hole for receiving said at least one lock member.

* * * * *